US008369135B1

(12) United States Patent
Mani

(10) Patent No.: US 8,369,135 B1
(45) Date of Patent: Feb. 5, 2013

(54) MEMORY CIRCUIT WITH CROSSOVER ZONES OF REDUCED LINE WIDTH CONDUCTORS

(75) Inventor: Krishnakumar Mani, San Jose, CA (US)

(73) Assignee: Magsil Corporation, Santa Clara, CA (US)

( * ) Notice: Subject to any disclaimer, the term of this patent is extended or adjusted under 35 U.S.C. 154(b) by 166 days.

(21) Appl. No.: 12/960,416

(22) Filed: Dec. 3, 2010

(51) Int. Cl.
G11C 11/00 (2006.01)
(52) U.S. Cl. ........................................ 365/158
(58) Field of Classification Search .................. 365/158
See application file for complete search history.

(56) References Cited

U.S. PATENT DOCUMENTS 6,807,092 B1 * 10/2004 Braun ........................... 365/173
2009/0096568 A1 * 4/2009 Hosoi et al. ..................... 338/20

\* cited by examiner

Primary Examiner — Huan Hoang
Assistant Examiner — Pablo Huerta
(74) Attorney, Agent, or Firm — Hahn and Moodley LLP; Vani Moodley, Esq.

(57) ABSTRACT

A memory circuit comprising a set of longitudinal conducting lines and a set of transverse conducting lines, wherein, each conducting line comprises alternating regions of reduced and increased line widths. The set of transverse conducting lines overlies the set of longitudinal conducting lines to define crossover zones wherein the reduced line width regions of the transverse conducting lines cross over the reduced line width regions of the longitudinal conducting lines. The circuit further comprises addressable magnetic storage elements, each disposed within a crossover zone between a longitudinal conducting line and a transverse conducting line thereof. The reduced line width regions improve magnetic flux efficiency in the magnetic storage elements and the increased line width regions lower the resistance in the conducting lines.

18 Claims, 4 Drawing Sheets

MEMORY CIRCUIT WITH CROSSOVER ZONES OF REDUCED LINE WIDTH CONDUCTORS

FIELD

Embodiments of the invention relate to a memory circuit using magnetic storage elements and particularly relate to magnetic random access memory (MRAM) circuits.

BACKGROUND

Memory circuits, that are based on magnetoresistive behavior of magnetic storage elements that are integrated typically with a complementary metal-oxide semiconductor (CMOS) technology, generally provide nonvolatility and an unlimited read and write endurance. A typical example is the magnetic random access memory (MRAM) circuit. The bit architecture in such circuits is generally based on a minimum size active transistor which serves as an isolation device in conjunction with a magnetic tunnel junction (MTJ) element or stack so as to define a bit for the memory circuit.

Though the aforesaid memory circuits have several desirable characteristics such as high speed, high density (i.e., small bit cell size), low power consumption, and no degradation over time, these have scalability issues. As the bit cells become smaller, the magnetic fields used for switching the memory state increase. Accordingly, current density and power required to provide the higher magnetic fields increase, thus limiting the scalability FIG. 1 illustrates a section of a typical layout for a memory circuit 100. The memory circuit comprises a set of word lines 102 and a set of bit lines 104. The set of bit lines 104 overlies the set of word lines 102 to define crossover zones 108. Addressable magnetic storage elements 110 are disposed within the crossover zones 108. Current drivers 106 are provided for the bit lines 104 and the word lines 102. A low line width for the set of word lines 102 and the set of bit lines 104 results in excessively high line resistance, while an excessive area of the crossover zones 108 can degrade the magnetic flux efficiency, due to low current density. Hence, memory cell designers are faced with the dichotomy of high line resistance and degraded magnetic flux efficiency.

SUMMARY OF THE INVENTION

According to a first aspect of the invention, a memory circuit comprises a set of longitudinal conducting lines and a set of transverse conducting lines, wherein each conducting line comprises alternating regions of reduced and increased line widths. The set of transverse conducting lines overlies the set of longitudinal conducting lines to define crossover zones at which, reduced line width regions of the transverse conducting lines cross over reduced line width regions of the longitudinal conducting lines. The circuit further comprises addressable magnetic storage elements, each disposed within a crossover zone between the longitudinal and transverse conducting lines.

In another embodiment, each of the magnetic storage elements comprises a magnetic tunnel junction (MTJ). In yet another embodiment, the set of longitudinal conducting lines forms a set of word lines and the set of transverse conducting lines forms a set of bit lines.

According to a second aspect of the invention, a magnetic random access memory (MRAM) circuit comprises a set of word lines and a set of bit lines, wherein each line comprises alternating regions of reduced and increased line widths. The set of bit lines overlies the set of word lines to define crossover zones at which reduced line width regions of the bit lines cross over reduced line width regions of the word lines. The circuit further comprises addressable magnetic storage elements, each disposed within a crossover zone between the word and bit lines thereof, wherein each storage element comprises a magnetic tunnel junction (MTJ).

In the two aforesaid aspects of the invention, the increased line width regions help lower the resistance of the conducting lines and the reduced line width regions help increase the magnetic flux efficiency.

The set of bit lines are formed in an M3 layer while the set of word lines are formed in an M2 layer. Each of the longitudinal and transverse conducting lines is about 2500 Angstroms in thickness. Each of the increased line width regions is about 170 nm, while each of the reduced line width regions is about 150 nm. Each of the magnetic storage elements has an area of about 130 nm×108 nm. In operation, the longitudinal and transverse conducting lines carry about 3-5 mA current.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1A:
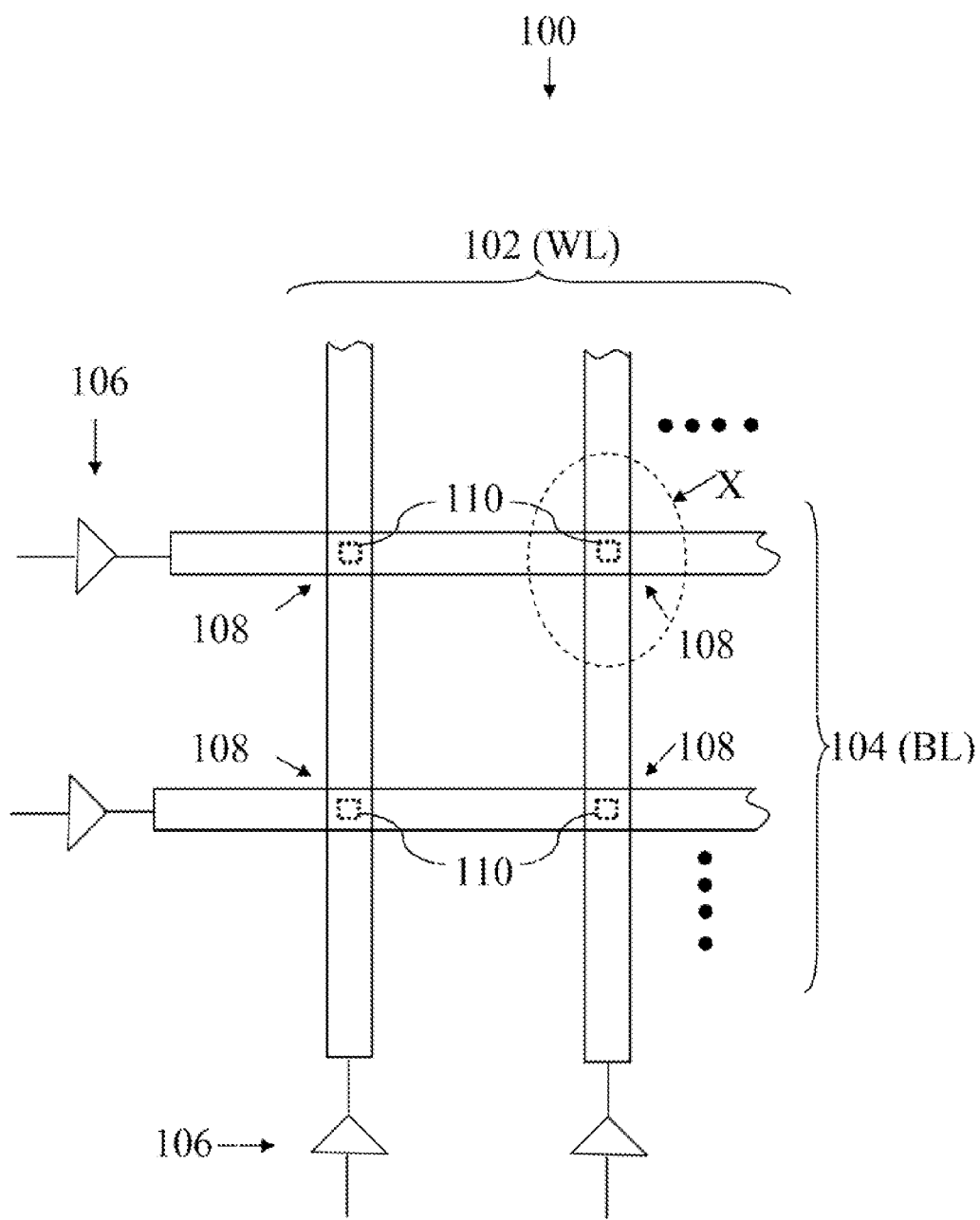
FIG. 1 illustrates a section of a typical layout for a memory circuit comprising a set of word lines and a set of bit lines with magnetic storage elements within the crossover zones as formed when the set of bit lines overlies the set of word lines.
Figure 1B:
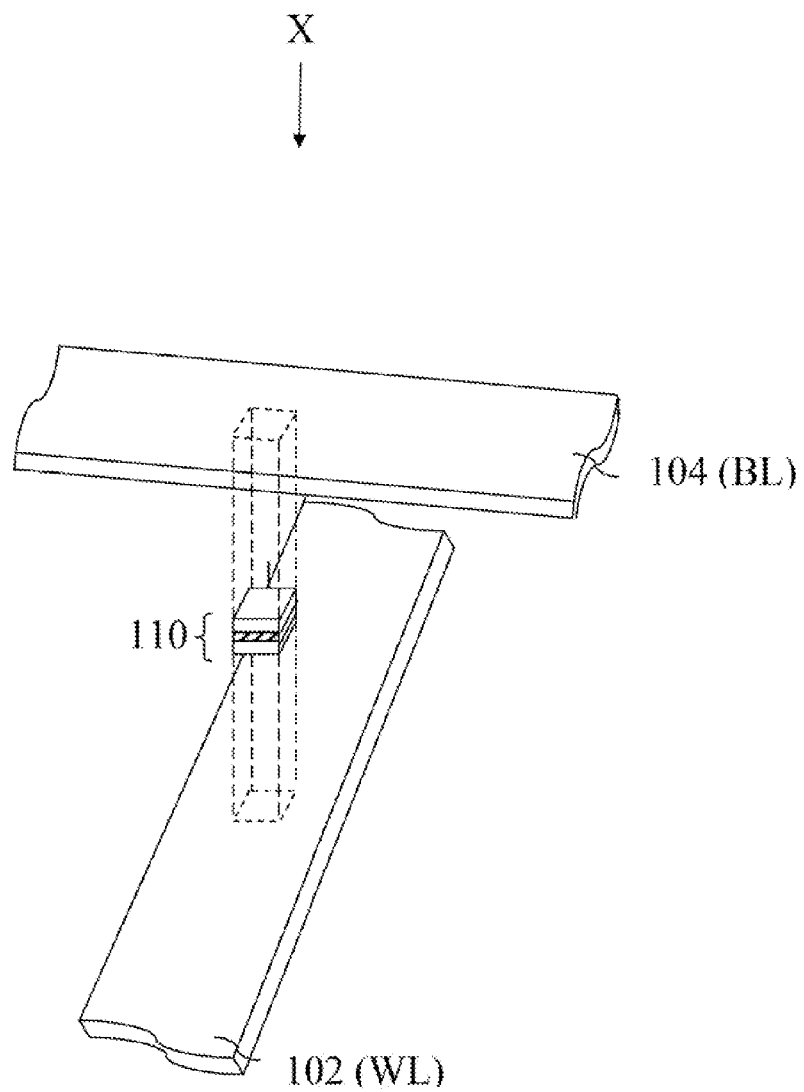
Figure 2A:
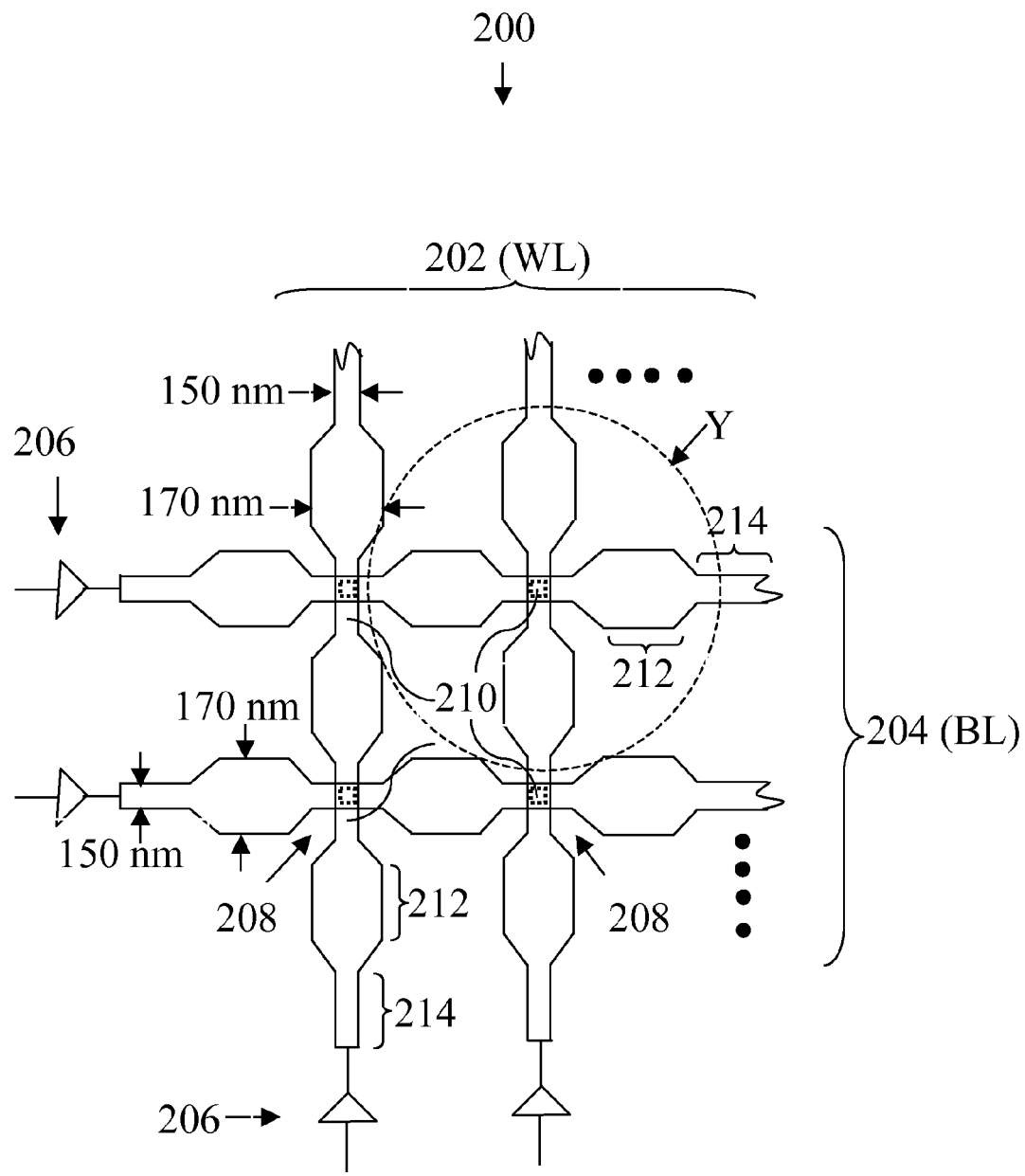
FIG. 2 illustrates a section of a layout for a memory circuit according to an embodiment of the invention, comprising a set of longitudinal conducting lines and a set of transverse conducting lines with magnetic storage elements within the crossover zones as formed when the set of the transverse conducting lines overlies the set of longitudinal conducting lines. Herein, each line comprises alternating regions of reduced and increased line widths.
Figure 2B:
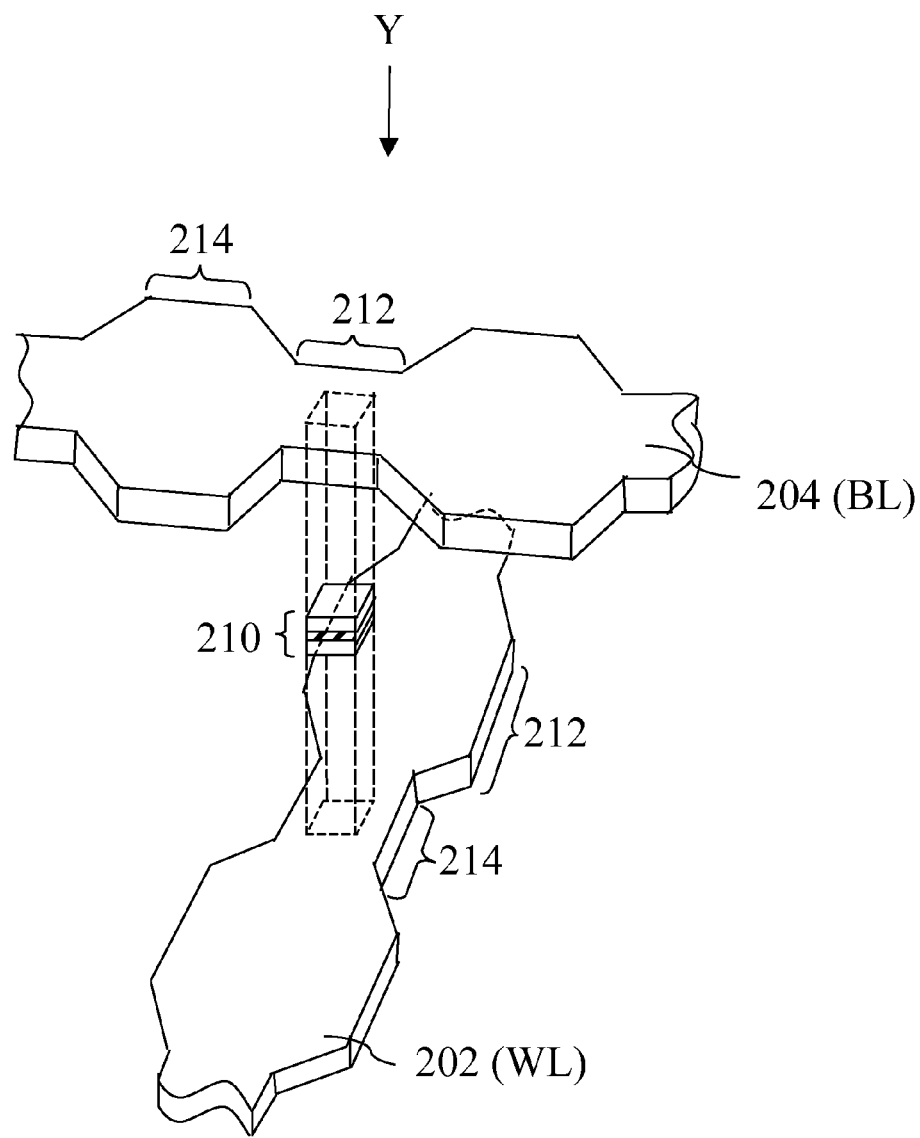

One embodiment of the present invention provides a novel memory circuit, As illustrated in FIG. 2, the memory circuit 200 comprises a set of longitudinal conducting lines 202 and a set of transverse conducting lines 204, each comprising alternating regions of reduced line width 212 and increased line width 214. Herein, the difference between the reduced line width 212 and the increased line width 214 is substantial. The invention is equally applicable when the angle between the longitudinal conducting lines 202 and the transverse conducting lines 204 is other than 90 degrees. The set of transverse conducting lines 204 overlies the set of longitudinal conducting lines 202 at the reduced line width regions 212 to define crossover zones 208. Addressable magnetic storage elements 210 are disposed, each within such a crossover zone 208. Each of the magnetic storage elements 210 within a crossover region 208 may comprise a magnetic tunnel junction (MTJ) (not shown). The invention is equally applicable when any other type of magnetic storage element 210 is used. In the embodiment shown, the set of longitudinal conducting lines 202 forms a set of word lines and the set of transverse conducting lines 204 forms a set of bit lines. Herein, the terms 'longitudinal' and 'transverse' are only relative to each other and may be used interchangeably. In accordance with one embodiment, The set of bit lines may be formed in an M3 layer and the set of word lines may be formed in an M2 layer of a backend process for fabrication of integrated circuits. However, any other set of consecutive layers in a backend process may equally be used, depending on the number of metal layers stacked in the backend process, the convenience of processing and the attainable performance for the memory circuit 200. The scope of the invention is also applicable when the longitudinal conducting lines 202 and the transverse conducting lines 204 are fabricated in a frontend process for fabrication of integrated circuits, for whatsoever reason. Each of the longitudinal conducting lines 202 and the transverse conducting lines 204 may be about 2500 Angstroms in thickness. However, other thicknesses may also be used. The respective thicknesses for the longitudinal conducting lines 202 and the transverse conducting lines 204 may also be different from each other. As shown in FIG. 2, each of the increased line width regions 214 is about 170 nanometer (nm), while each of the reduced line width regions 212 is about 150 nm, though other values may also be used. Different values of the increased line width regions 214 and the reduced line width regions 212 may be used for the longitudinal conducting lines 202 and for the transverse conducting lines 204. The term 'about' includes a typical processing variation under the fabrication process, as within ±10%. Similarly, as shown, each of the magnetic storage elements has an area of about 130 nm×108 nm, though other areas may equally be used. Again, the term 'about' includes a typical processing variation under the fabrication process, as within ±10%. In operation, the longitudinal conducting lines 202 and the transverse conducting lines 204 may carry about 3-5 milliampere (mA) current. However, the invention is equally applicable to designs for carrying other current values as well, with the aid of current drivers 206. With the increased line width regions 214, a reduction in the line resistance by about 25-30% can be practically achieved, when compared to the case when the increased line width region 212 is not used. Only two longitudinal conducting lines 202 and two transverse conducting lines 204 are shown for representing the inventive concept. The scope of the invention however does not limit the respective numbers of these lines. The scope of the invention is also not limited to any particular technology in terms of processing sequence, materials, physical dimensions and the like.

The embodiments of the present invention may be applied to memory circuits for applications in any area, such as in automotive, mobile phone, smart card, radiation hardened military applications, database storage, Radio Frequency Identification Device (RFID), MRAM elements in field-programmable gate array (FPGA) and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A memory circuit, comprising:
   a set of longitudinal conducting lines, each comprising alternating regions of reduced and increased line widths;
   a set of transverse conducting lines, each comprising alternating regions of reduced and increased line widths, wherein said set of transverse conducting lines overlies said set of longitudinal conducting lines to define crossover zones at which reduced line width regions of said transverse conducting lines cross over reduced line width regions of said longitudinal conducting lines; and
   addressable magnetic storage elements, each disposed within a crossover zone between said longitudinal and transverse conducting lines thereof.

2. The memory circuit of claim 1, wherein each of said magnetic storage elements comprise a magnetic tunnel junction (MTJ).

3. The memory circuit of claim 1, wherein said set of longitudinal conducting lines forms a set of word lines and said set of transverse conducting lines forms a set of bit lines.

4. The memory circuit of claim 3, wherein said set of bit lines is formed in an M3 layer and said set of word lines is formed in an M2 layer.

5. The memory circuit of claim 1, wherein each of said longitudinal conducting lines is about 2500 Angstroms in thickness.

6. The memory circuit of claim 1, wherein each of said transverse conducting lines is about 2500 Angstroms in thickness.

7. The memory circuit of claim 1, wherein each of said increased line width regions is about 170 nm, while each of said reduced line width regions is about 150 nm.

8. The memory circuit of claim 1, wherein each of said magnetic storage elements has an area of about 130 nm×108 nm.

9. The memory circuit of claim 1, wherein in operation, said longitudinal conducting lines carry about 3-5 mA current.

10. The memory circuit of claim 1, wherein in operation, said transverse conducting lines carry about 3-5 mA current.

11. A magnetic random access memory (MRAM) circuit, comprising:
    a set of word lines, each comprising alternating regions of reduced and increased line widths;
    a set of bit lines, each comprising alternating regions of reduced and increased line widths, wherein said set of bit lines overlies said set of word lines to define crossover zones at which reduced line width regions of said bit lines cross over reduced line width regions of said word lines; and
    addressable magnetic storage elements, each disposed within a crossover zone between said word and bit lines thereof, wherein each storage element comprises a magnetic tunnel junction (MTJ).

12. The MRAM circuit of claim 11, wherein said set of bit lines is formed in an M3 layer and said set of word lines is formed in an M2 layer.

13. The MRAM circuit of claim 11, wherein each of said word lines is about 2500 Angstroms in thickness.

14. The MRAM circuit of claim 11, wherein each of said bit lines is about 2500 Angstroms in thickness.

15. The MRAM circuit of claim 11, wherein each of said increased line width regions is about 170 nm, while each of said reduced line width regions is about 150 nm.

16. The MRAM circuit of claim 11, wherein each of said magnetic storage elements has an area of about 130 nm×108 nm.

17. The MRAM circuit of claim 11, wherein in operation, said word lines carry about 3-5 mA current.

18. The MRAM circuit of claim 11, wherein in operation, said bit lines carry about 3-5 mA current.

* * * * *